(12) United States Patent
Vervoordeldonk et al.

(10) Patent No.: US 8,279,401 B2
(45) Date of Patent: Oct. 2, 2012

(54) POSITION CONTROL SYSTEM, A LITHOGRAPHIC APPARATUS AND A METHOD FOR CONTROLLING A POSITION OF A MOVABLE OBJECT

(75) Inventors: Michael Johannes Vervoordeldonk, Rosmalen (NL); Mark Constant Johannes Baggen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 627 days.

(21) Appl. No.: 12/426,125

(22) Filed: Apr. 17, 2009

(65) Prior Publication Data
US 2009/0268185 A1  Oct. 29, 2009

Related U.S. Application Data

(60) Provisional application No. 61/071,389, filed on Apr. 25, 2008.

(51) Int. Cl.
*G03B 27/42* (2006.01)
*G03B 27/58* (2006.01)
*G03B 27/62* (2006.01)
*G03B 27/32* (2006.01)
*G03B 27/68* (2006.01)

(52) U.S. Cl. ............... 355/53; 355/52; 355/72; 355/75; 355/77

(58) Field of Classification Search .............. 355/52, 355/53, 55, 67–77; 356/399–401; 250/442.11, 250/492.1, 492.2, 492.22, 493.1, 548; 378/34; 700/44
See application file for complete search history.

(56) References Cited

U.S. PATENT DOCUMENTS

| | | | | |
|---|---|---|---|---|
| 5,184,055 A * | 2/1993 | Ohishi et al. | | 318/615 |
| 5,532,565 A * | 7/1996 | Vervoordeldonk | | 318/610 |
| 5,610,715 A * | 3/1997 | Yoshii et al. | | 356/499 |
| 5,653,317 A * | 8/1997 | Wakui | | 188/378 |
| 5,900,707 A * | 5/1999 | Wakui | | 318/625 |
| 6,202,492 B1 * | 3/2001 | Ohsaki | | 73/662 |
| 6,330,052 B1 * | 12/2001 | Yonekawa et al. | | 355/53 |
| 7,098,990 B2 * | 8/2006 | Butler | | 355/53 |
| 2004/0041478 A1 * | 3/2004 | Ohtachi et al. | | 310/90.5 |
| 2004/0085035 A1 * | 5/2004 | Tazawa et al. | | 318/432 |
| 2004/0164253 A1 * | 8/2004 | Ito | | 250/491.1 |
| 2004/0176861 A1 * | 9/2004 | Butler | | 700/63 |
| 2005/0243458 A1 * | 11/2005 | Iwashiro | | 360/77.02 |
| 2006/0087632 A1 * | 4/2006 | Tousain | | 355/53 |
| 2006/0119829 A1 * | 6/2006 | Cox et al. | | 355/72 |
| 2006/0285101 A1 * | 12/2006 | Butler et al. | | 355/75 |
| 2007/0051160 A1 * | 3/2007 | Pril et al. | | 73/1.79 |
| 2007/0258079 A1 * | 11/2007 | Kamidi et al. | | 355/72 |
| 2008/0246200 A1 * | 10/2008 | Varvoordeldonk et al. | | 267/140.14 |
| 2008/0246936 A1 * | 10/2008 | Loopstra et al. | | 355/53 |

* cited by examiner

*Primary Examiner* — Peter B Kim
*Assistant Examiner* — Christina Riddle
(74) *Attorney, Agent, or Firm* — Pillsbury Winthrop Shaw Pittman LLP (57) ABSTRACT

A position control system configured to control the position of a movable object, includes: a position measurement system configured to determine a position of a sensor or sensor target on the movable object, a comparator configured to provide an error signal by comparing a set-point position and a position feed-back signal based on the measured position, a controller to provide a control signal based on the error signal, a feed-forward device to provide a feed-forward signal on the basis of a first signal related to the desired position, and one or more actuators configured to act on the movable object based on the control signal and the feed-forward signal, wherein the position control system further includes a compliance compensation device providing a compliance compensation signal, wherein the compliance compensation signal is subtracted from a measured position of the position measurement system to obtain the feed-back position signal.

28 Claims, 4 Drawing Sheets

POSITION CONTROL SYSTEM, A LITHOGRAPHIC APPARATUS AND A METHOD FOR CONTROLLING A POSITION OF A MOVABLE OBJECT

CROSS REFERENCE TO RELATED APPLICATIONS

This application claims priority and benefit under 35 U.S.C. §119(e) to U.S. Provisional Patent Application No. 61/071,389, entitled "Position Control System, A Lithographic Apparatus and A Method For Controlling A Position Of A Movable Object", filed on Apr. 25, 2008. The content of that application is incorporated herein in its entirety by reference.

FIELD

The present invention relates to a position control system, a lithographic apparatus and a method for controlling a position of a movable object.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A conventional lithographic apparatus includes a position control system configured to control the position of the substrate support. This position control system includes a position measurement system which is configured to measure a position of a number of sensors or sensor targets mounted on the substrate support. On the basis of the measured positioned of the sensor or sensor targets the position of another location of the substrate support, for instance a target portion on a substrate for a patterned beam of radiation, may be determined.

During use of the lithographic apparatus forces may be exerted on the substrate support. For instance, during the expose phase, i.e. during projection of the patterned beam on a target portion of the substrate level, level actuations may be performed to position the upper surface of the substrate in a correct orientation with respect to the lens column. As the stiffness of the substrate support is limited, the level actuations or other accelerations may cause temporary deformations of the substrate support. Such deformations may lead to focus errors and/or offset in overlay.

To reduce the risk of deformations of the substrate support and as a consequence focus errors or overlay offset, it has been proposed to increase the stiffness of the substrate support. However, the increasing demand on accuracy and speed of the positioning of the substrate support, the possibilities to increase the stiffness of the substrate support without encountering further problems, for instance with respect to weight have come to their limits.

SUMMARY

An encoder type measurement system may be used for the measurement system. Such encoder-type measurement system may include one or more sensors mounted on the movable object and at least one sensor target object, for instance a sensor target plate including a grating or grid, the sensor target object mounted on a substantially stationary frame, in particular a so-called metrology frame (metro-frame). The sensor target object may include a one-dimensional or multi dimensional grating. In an embodiment, the sensor target object will be typically in the form of a plate on which a two dimensional orthogonal grid is arranged. Such sensor target object is often referred to as grid, grating or grid plate.

During use of the encoder-type measurement system it may be possible that one of the encoder heads on the stage falls outside the working area of the grid plate, in particular when one the encoder heads is located close to or under the projection system. As a result, this encoder head may not be used for position measurement.

An encoder heads of a redundant set of encoder heads may be mounted on different locations on the substrate support, so that when one of the encoder heads cannot be used for position measurement, the other encoder heads may determine the position of the substrate support.

For instance, in a particular embodiment, the position measurement system includes four encoder heads arranged at the corners of the stage, each encoder head being capable of measuring a position of the stage in two directions. When one of the encoder heads cannot be used the other can provide a position measurement in six degrees of freedom. When all four encoder heads can be used for position measurement, the redundant set of encoder heads may be used for calibration.

When the substrate support is moved with respect to the lens column, it is possible that subsequently a different encoder head can not be used for position measurement. This has the consequence that different sets of encoder heads have to be used for position measurement at different positions. During movement of the substrate support, depending on the position of the substrate support, there may be switched between different sets of encoder heads in order to obtain an optimal position measurement.

During the switching between different sets of encoder heads, it may be assumed that the position measurement of each of the encoder heads is correct, and that on the basis of any set of encoder heads the position of any location on the substrate support may be determined accurately. However, due to internal deformations, the shape of the substrate support may temporarily change, in particular when the substrate support is accelerated or decelerated. As a consequence, the encoder heads may not constantly be located in the same position with respect to each other. Switching between different sets of encoder heads may result in a different measured position of a certain location on the substrate support. Such difference in measured position may lead to an error signal fed to the controller device of the position control system.

Thus, switching between different sets of encoder heads may result in a reaction of the position control system which may be undesirable. For instance, switching between different sets of encoder heads may lead to incorrect positioning or increased settling time.

It is desirable to improve the accuracy and/or response time of a position control system of a movable support. In particular, it is desirable to improve the accuracy and/or response time of a position control system in which is switched between different sets of measurement devices.

According to an embodiment of the invention, there is provided a position control system configured to control a position of a movable object, the system including a position measurement system configured to measure a position of the movable object with a sensor and a sensor target, the sensor being arranged on the movable object and the sensor target being substantially stationary, or vice versa, the position measurement system configured to output a measured position signal representative of the measured position of the movable object; a comparator configured to provide an error signal; a controller configured to provide a control signal based on the error signal; a feed-forward device configured to provide a feed-forward signal based on a first signal related to a desired position; one or more actuators configured to act on the movable object based on the control signal and the feed-forward signal, and a compliance compensator configured to provide a compliance compensation signal, wherein the error signal is based on a set-point position signal, the measured position signal, and the compliance compensation signal.

According to an embodiment of the invention, there is provided a lithographic apparatus including a patterning device support configured to support a patterning device, the patterning device being capable of imparting a radiation beam with a pattern in its cross-section to form a patterned radiation beam; a substrate support constructed to hold a substrate; a projection system configured to project the patterned radiation beam onto a target portion of the substrate; and a position control system configured to control a position of a movable object, the system including a position measurement system configured to measure a position of the movable object with a sensor and a sensor target, the sensor being arranged on the movable object and the sensor target being substantially stationary, or vice versa, the position measurement system configured to output a measured position signal representative of the measured position of the movable object; a comparator configured to provide an error signal; a controller configured to provide a control signal based on the error signal; a feed-forward device configured to provide a feed-forward signal based on a first signal related to a desired position; one or more actuators configured to act on the movable object based on the control signal and the feed-forward signal, and a compliance compensator configured to provide a compliance compensation signal, wherein the error signal is based on a set-point position signal, the measured position signal, and the compliance compensation signal.

According to an embodiment of the invention, there is provided a method for controlling the position of a movable object, including determining a position of a sensor or sensor target on the movable object; determining an error signal; generating a control signal based on the error signal; generating a feed-forward signal based on a first signal related to a desired position of the movable object; actuating one or more actuators based on the control signal and the feed-forward signal, and providing a compliance compensation signal, wherein the error signal is determined by comparing a set-point position signal, a signal representative of the measured position of the movable object, and the compliance compensation signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
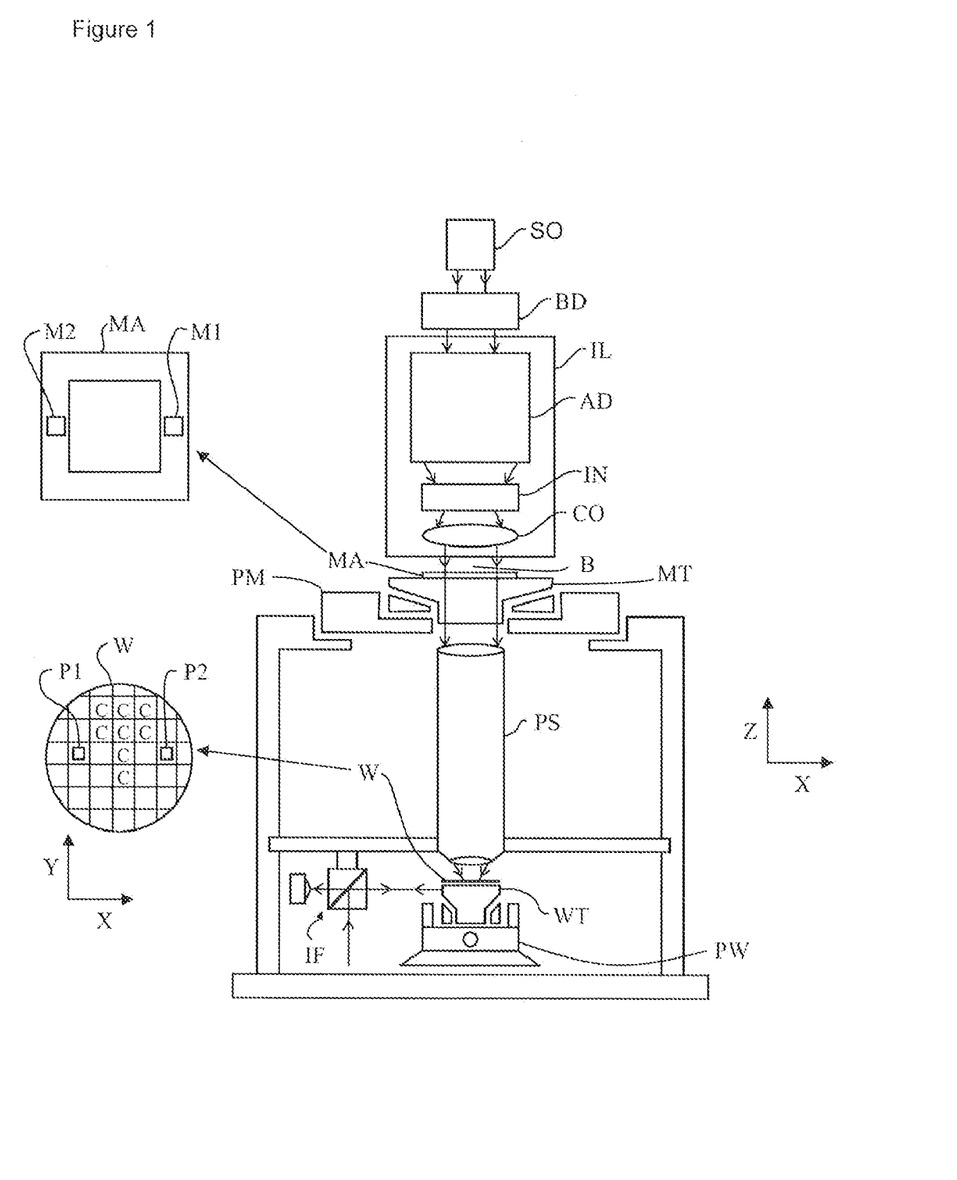
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate support or table (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features.

Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device supports (e.g. mask tables). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
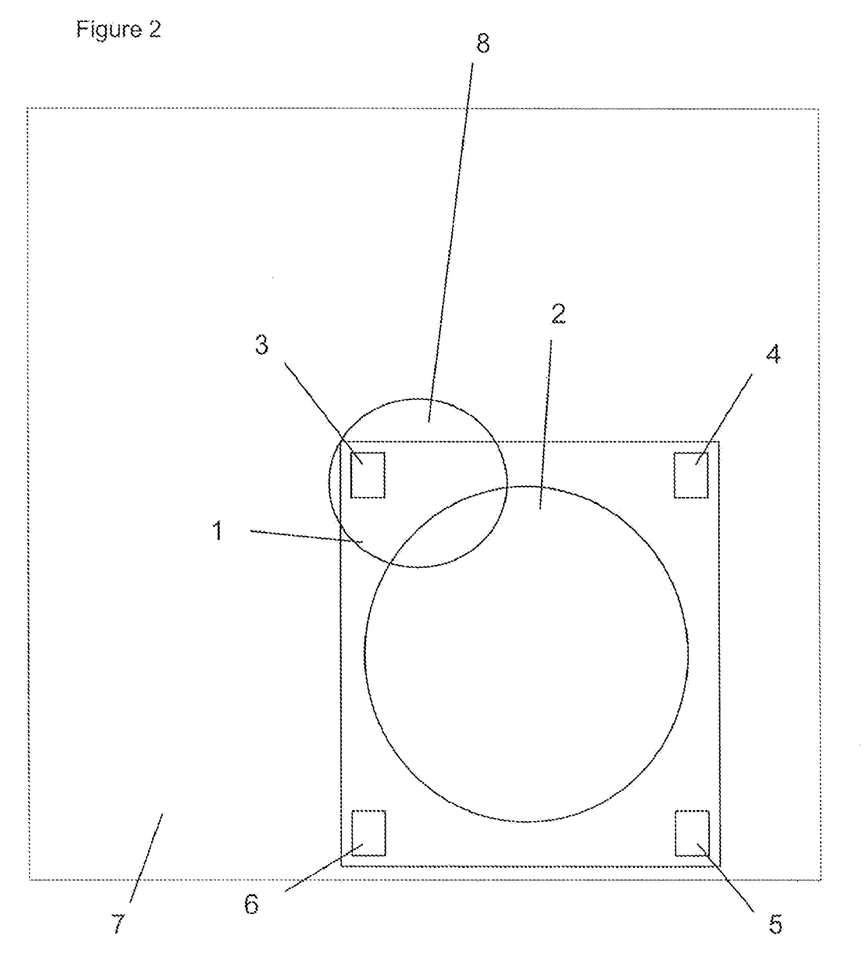
FIG. 2 shows a top view of a substrate support including an encoder type position measurement system including a redundant set of encoder heads.

FIG. 2 shows a top view of a substrate support 1 carrying a substrate 2 in accordance with an embodiment of the invention. On the substrate support four encoder heads 3, 4, 5, 6 of an encoder-type position measurement system are mounted, each being configured to determine a position in two degrees of freedom with respect to a stationary grid plate 7. The stationary grid plate 7 is located above the substrate support 1, and the substrate support 1 mainly moves in the directions parallel to the grid plate 7. In the grid plate 7 a central hole 8 is arranged for letting pass the projection beam of a projection system which is mainly located above the grid plate 7. In another embodiment, the grid plate is arranged on the substrate support 1 and the encoder heads are stationary.

Each of the encoder heads 3, 4, 5, 6 is only capable of determining a position of the substrate support 1 when it is aligned with the grid plate 7. In the position of the substrate support 1 as shown in FIG. 2 the encoder heads 4, 5, and 6 are aligned with the grid plate 7, and a position of the substrate support can be determined in six degrees of freedom. However, the encoder head 3 cannot be used for determination of the position of the substrate support as it is not aligned with the grid plate 7, since it is located opposite the central hole 8. It is remarked that the term aligned is used to indicate that the encoder head is positioned with respect to the grid plate at a location in which the encoder head is capable of determining a position or change in position with respect to the grid plate 7.

When the substrate support 1 is moved to another position, it may be possible that the encoder head 3 again may be aligned with the grid plate 7 so that it can be used for position measurement, while one of the encoder heads 4, 5, or 6 may no longer be aligned with the grid plate 7 so that the respective encoder head 4, 5, or 6 cannot be used for position measurement.

The position measurement system is configured such that in each expected and/or possible position of the substrate support 1, at least three encoder heads 3, 4, 5, 6 are aligned with the grid plate 7 so that position measurement in six degrees of freedom is possible.

Thus, on the substrate support 1 a redundant set of encoder heads 3, 4, 5, 6, is mounted in order to make position measurement also possible when one of the encoder heads 3, 4, 5, 6 cannot be used for position measurement. Since the encoder head which cannot be used for position measurement may not be the same, it is desired, dependent on the position of the substrate support to switch between different sets of encoder heads in order to make continuous position measurement possible.

The switching between different sets of encoder heads, i.e. a selected set of three or all four, is also referred to as take-over. Such take-over may lead to errors in the determination of the position of the substrate support as the result of the finite stiffness of the substrate support.

During acceleration, the substrate support may deform due to acceleration forces. In other words, during the acceleration phase the relative position among the various encoder combinations is no longer fixed.

As a result, a take-over during the acceleration phase may result in a discontinuous stage position measurement due to the switching from one encoder combination to another. Though the deformation will no longer exist during exposure, since exposure takes place at constant velocity, the discontinuity in the position measurement during take-over causes a step-response of the servo error that could still be ongoing after the acceleration phase has finished. As a result, the step response caused by the discontinuity may not have yet settled when an exposure phase of the lithographic apparatus starts.

Even without take-over, the finite internal stiffness of the substrate support may be a source of servo errors of the stage. In prior art position control systems a combination of acceleration feed-forward and snap feed forward has been proposed to cope with this finite stiffness. Acceleration feed-forward provides the nominal force to accelerate the substrate support, while the snap feed forward provides additional force to compensate for the internal deformation. In other words, the snap-force corrects the position of the substrate support such that, in spite of the internal deformation, the encoder tracks the set-point and the servo error remains small.

During a take-over, the tuning of the snap-feed forward depends on the dynamics of the system-to-be-controlled (the stage). When take over occurs, the stage dynamics—as seen by the controller changes, and it is desirable to provide a new tuning of the snap feed forward. In other words, the take-over phenomenon makes the snap feed forward position dependent.

Figure 3:
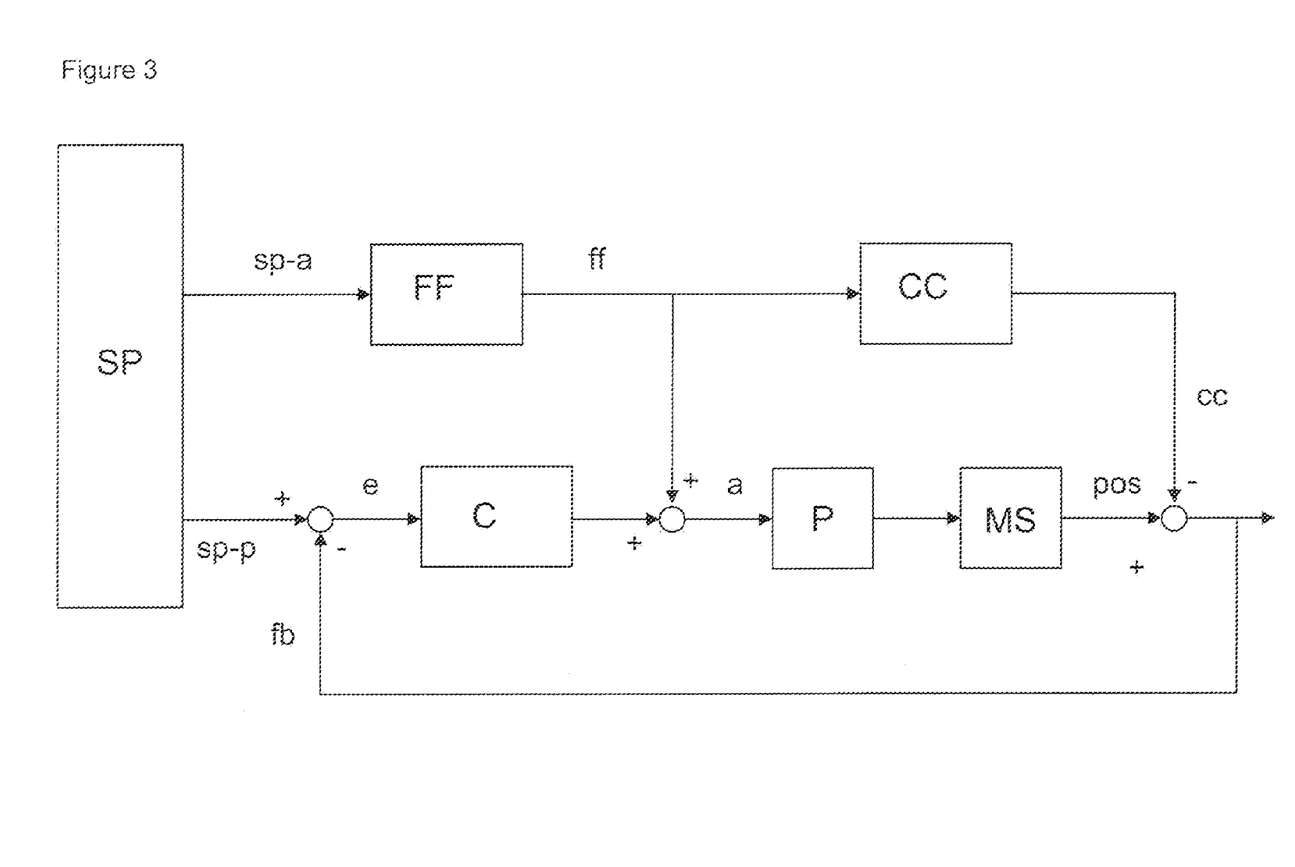
FIG. 3 shows an embodiment of a control scheme of a position control system according to the invention.

FIG. 3 shows an alternative solution to cope with the servo accuracy problems caused by take-over during acceleration of a substrate support. FIG. 3 shows a control scheme of a substrate support. The mechanics of the substrate support is indicated with the systems block P. The position of the substrate support is measured by a position measurement system MS.

A feedback signal representative of the actual position of the substrate support is subtracted from a position set-point sp-p which is generated by a set-point generator SP to obtain an error signal e. The set-point generator SP may be a separate system, but also a part of a central processor or such. The error signal e is fed into a controller C which provides a control signal on the basis of the error signal e. The controller C may be any suitable type of controller such as a PI or PID controller.

The control system includes a feed-forward device FF which provides a feed-forward signal ff which is added to a control signal to obtain an actuator signal which is used to actuate the one or more respective actuators. The feed-forward signal is based on an acceleration set-point signal sp-a which is generated by the set-point generator SP and fed into the feed-forward device.

The control system further includes a compliance compensation device CC which provides a compliance compensation signal cc which is subtracted from the measured position pos as measured by the position measurement system MS. The compliance compensation device is configured to approximate the effect of internal deformation of the substrate support on the measured position. This approximation of the effect of internal deformation of the substrate support on the measured position is subtracted from the measured position to obtain the feedback signal which is fed back and subtracted from the position set-point signal sp-p. The resulting error signal e substantially does not include the effect of internal deformation as this effect is compensated by the subtraction of the compliance compensation signal, which is a good measure of the force applied to the substrate.

The compliance compensation device CC calculates the compliance compensation signal cc on the basis of the feed-forward signal. Any other suitable signal may also be used. The compliance compensation device includes a compliance compensation gain. In the present embodiment this compliance compensation gain gives the relationship between the acceleration of the substrate support and the resulting effect on the position of the respective encoder head due to the internal deformation of the substrate support.

An example of a calculation of these compliance compensation gains will now be given. It may also be possible to obtain the compliance compensation gain in another way, for instance, by approximation using system identification techniques, time domain optimization techniques, or any other suitable methods or combinations thereof.

Example

Neglecting the (little) damping that may be present in the substrate support, the relation between actuator force F and measured position x, may be expressed as a sum of second order systems or modes (in Laplace domain):

$$\frac{x}{F}(s) = \frac{1}{m_1 s^2} + \sum_{i=2}^{\infty} \frac{a_i}{m_i s^2 + k_i}, \quad (1)$$

with s the Laplace operator, $a_i$ a constant (depending on the location of x and F), $m_i$ the modal mass and $k_i$ the modal stiffness.

The first term on the right hand side describes the rigid body behavior of the substrate support (and m1 is equal to the substrate support mass), while the second term represents the internal modes of the substrate support. If the substrate support were infinitely stiff, the second term would be absent.

A set-point signal forces the system to move and simultaneously causes internal deformation. Due to the character (or frequency content) of the set-points used, the internal modes (second right hand term of (1)) are hardly dynamic, but mostly static excited. As a result, (1) can be approximated by $$\frac{x}{F}(s) \approx \frac{1}{m_1 s^2} + \sum_{i=2}^{\infty} \frac{a_i}{k_i}. \quad (2)$$

Now suppose there are two sensors, x1 and x2. Based on (2), the relation between de sensors and the actuator can be approximated by:

$$x_1 = \frac{1}{m_1 s^2} F + \sum_{i=2}^{\infty} \frac{a_{i,1}}{k_i} F = \frac{1}{m_1 s^2} F + c_1 F \quad (3)$$

$$x_2 = \frac{1}{m_1 s^2} F + \sum_{i=2}^{\infty} \frac{a_{i,2}}{k_i} F = \frac{1}{m_1 s^2} F + c_2 F. \quad (4)$$

The parameters c1 and c2 have the dimension of compliance. They describe the deformation at the location of sensor 1 resp. 2 in meters per Newton excitation force (c in m/N).

When switching from sensor 1 to sensor 2 the following discontinuity in measured position occurs:

$$\Delta = x_1 - x_2 = (c_1 - c_2) F. \quad (5)$$

For a substrate support, the discontinuity may for instance vary from approximately 30 nm in horizontal direction to approximately 600 nm in vertical direction.

According to an embodiment of the invention, the (approximated) internal deformation at the location the respective sensor (c1F and c2F in (3) resp. (4)) is subtracted from the measured position, before the measurement position signal is fed back to the comparator wherein the measurement position signal is subtracted from the position set-point signal.

As the feed forward term represents most, for instance >99% of the total servo force acting on the substrate support, this signal is used to reflect the force F acting on the substrate support. By using a signal based on a set-point an extra feedback loop in the control system is avoided.

The compensated sensor signals x1,cc and X2,cc are now approximated by $$x_{1,cc} = \frac{1}{m_1 s^2} F$$

$$x_{2,cc} = \frac{1}{m_1 s^2} F.$$

When take-over occurs, there is substantially no discontinuity in the feedback signal fb anymore as the effect of internal deformation is substantially compensated by subtracting the compliance compensation signal cc of the measured position pos of the substrate support.

Use of the acceleration feed forward ff rather than a measured actuator force, for instance a as input for the compliance compensation device CC may be desirable in an embodiment. This guarantees that during exposure (constant velocity) the CC does not influence the actual measured position.

In the example only one force F and two sensors x1 and x2 are used. The resulting compliance compensation gain includes two scalars, representing c1 and c2.

Compliance compensation may be applied in any desired degree of freedom. For a substrate support compliance compensation may only be used in the main directions of movement of the substrate support. Normally, the substrate support mainly moves in the plane parallel to the grid plate 7 often referred to as the x- and y-directions. To obtain compliance compensation in the two main directions a compliance compensation gain for each direction has to be derived for each encoder head.

For a substrate support with four 2D encoders there are eight parameters per force excitation direction, i.e. one compliance compensation gain in m/N per encoder head DOF, and per excitation direction). Assuming that only large force excitations occur in x- and y-direction (step and scan respectively), sixteen parameters suffice to fully describe the compliance compensation device CC, which then becomes a multi-input multi-output (MIMO) matrix gain of size 8×2.

Since compliance compensation substantially predicts the effect of the internal deformation on the measured position and subtracts this effect from the measured position of the encoder head, the effect caused by internal deformation is substantially no longer present in the feedback signal fb which is compared with the position set-point sp-p. As a result, the discontinuity during switching between different sets of encoder heads is substantially taken away.

In this respect it is remarked that compliance compensation is substantially different than snap feed forward. Whereas snap feed forward excites the substrate support to enforce the sensor to better track the set-point signal, compliance compensation masks the (temporarily present) deformation and thus allows the substrate support for a smoother ride.

In the shown embodiment compliance compensation is based on the feed-forward signal, not on a feedback signal, such as the actual actuator force. The feed forward signal suffices as this represents almost all of the actuator force. Using a feed forward signal may make it impossible for the compliance compensation to create an unstable system. Furthermore, using a feed-forward signal may guarantee that the compensation is zero during exposure when at least in the main directions of movements no acceleration is provided.

A further benefit of the compliance compensation is that the substrate support deformation only depends on the acceleration force, and is independent of the position of the substrate support. As compliance compensation compensates the encoder deformation, the CC is also position independent.

Figure 4:
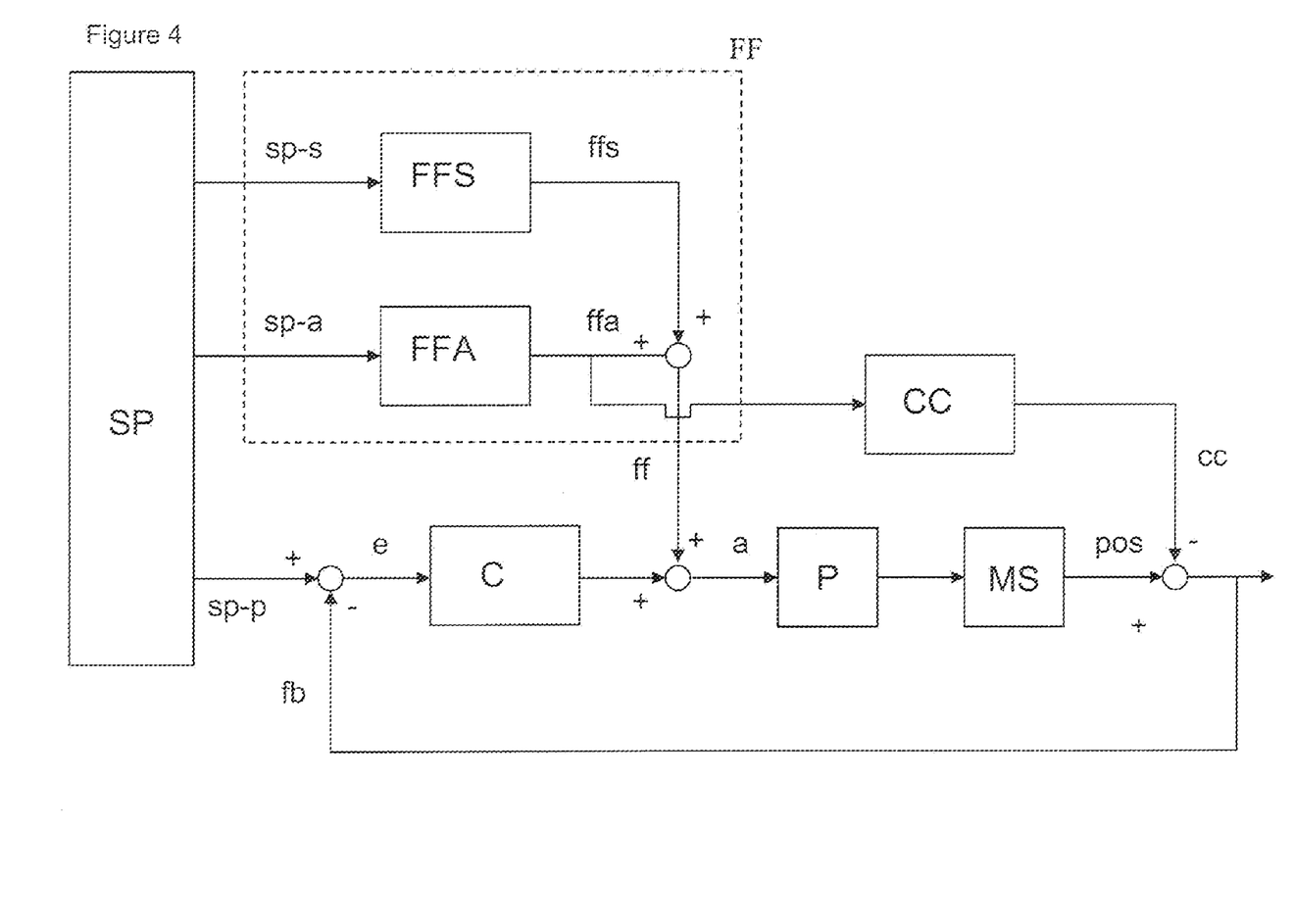
FIG. 4 shows an embodiment of a control scheme of a position control system according to the invention.

FIG. 4 shows an alternative embodiment of a control scheme using a compliance compensation device in order to take into account internal deformation. The control scheme of FIG. 3 mainly corresponds with the control scheme of FIG. 4. The only difference of the control scheme of FIG. 3 and FIG. 4 is the (re)introduction of snap feed-forward.

In the feed-forward device FF of the control scheme of FIG. 4, the feed-forward device FF shown in dashed lines includes a acceleration feed-forward device FFA which provides an acceleration feed-forward signal ffa on the basis of the acceleration set-point sp-a. The feed-forward device FF further includes a snap feed-forward device FFS which provides a snap feed-forward signal ffs on the basis of the snap set-point sp-s. The acceleration feed-forward signal and the snap feed-forward signal are added to the signal of the controller to provide the actuator signal a. The acceleration feed-forward signal ffa is further used as input signal for the compliance compensation device CC.

As explained with respect to the embodiment of FIG. 3, the compliance compensation device is an attractive alternative for snap feed-forward since compliance compensation may be implemented position-independent and take over between different sets of sensor can be carried out without introducing a substantial discontinuity in the control system. It is remarked that when substantially the same results should be obtained with a snap feed-forward device, the feed-forward device should be MIMO and position dependent. Furthermore, take over between different sets of sensors may still lead to discontinuities and as a result in servo errors.

However, the residual errors of the use of compliance compensation may be somewhat larger than the residual errors which remain in a system using snap feed-forward only.

The addition of a snap feed-forward device may decrease the residual errors in the control scheme as shown in FIG. 3. The snap feed-forward device may be optimized for decreasing the residual errors, which may result in even better attenuation of the residual errors of the position control system.

The snap feed-forward device FFS may be single input-single output (SISO) as it is not used for compensation of the internal deformation of the substrate support.

Thus, the combination of a compliance compensation device for masking the effect of internal deformation in the measured position of the encoder heads, and a SISO snap feed-forward device for attenuation of the residual errors provides an accurate position control system in which take over between different sets of sensors is possible without the introduction of discontinuities in the position measurement. Furthermore, a limited set of compliance compensation gains is required for providing compliance compensation in the main directions of a substrate support.

When further attenuation of residual errors is not desired, or provided in an other way the snap feed-forward device may be omitted. In such position control system a compliance compensation device may be provided without a snap feed-forward device.

The use of a compliance compensation device was described with respect to a substrate support of a lithographic apparatus. The position control system may also be used for other movable objects which have to be controlled with high accuracy, in particular when take-over between different sets of sensors is required.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A position control system configured to control a position of a movable object, the system comprising:
    a position measurement system configured to measure a position of the movable object with a sensor and a sensor target, the sensor being arranged on the movable object and the sensor target being substantially stationary, or vice versa, the position measurement system configured to output a measured position signal representative of the measured position of the movable object;
    a comparator configured to provide an error signal;
    a controller configured to provide a control signal based on the error signal;
    a feed-forward device configured to provide a feed-forward signal based on a first signal related to a desired position;
    one or more actuators configured to act on the movable object based on the control signal and the feed-forward signal;
    a compliance compensator configured to provide a compliance compensation signal, and
    a module configured to receive the measured position signal and the compliance compensation signal and provide a feedback signal based on the measured position signal and the compliance compensation signal, the feedback signal to be received by the comparator,
    wherein the error signal is determined using a set-point position signal, the measured position signal, and the compliance compensation signal.

2. The position control system of claim 1, wherein the error signal is calculated by adding the compliance compensation signal to the set-point position signal and subtracting the measured position signal.

3. The position control system of claim 1, wherein the error signal is calculated by subtracting the compensation signal from the measured position signal and subtracting the feedback signal from the set-point position signal.

4. The position control system of claim 1, wherein the compliance compensation signal is selected to approximate an effect of internal deformation of the movable object on the measured position.

5. The position control system of claim 1, wherein the compliance compensation signal is based on the feed-forward signal.

6. The position control system of claim 1, wherein the compliance compensation device comprises a compliance compensation gain.

7. The position control system of claim 6, wherein the compliance compensation gain is based on an approximation of internal modes of the movable object.

8. The position control system of claim 6, wherein the compliance compensation gain is based on an approximation of a static part of internal modes of the movable object.

9. The position control system of claim 1, wherein the position measurement system comprises a redundant set of sensors, each of the sensors having its own compliance compensation gain.

10. The position control system of claim 1, wherein the position measurement system is an encoder position measurement system, wherein the position measurement system comprises one or more encoder heads mounted on the movable object and a substantially stationary sensor target comprising a grid or grating.

11. The position control system of claim 1, wherein the feed-forward device is configured to provide a feed-forward signal representative of an acceleration of the movable object.

12. The position control system of claim 11, wherein the feed-forward device is configured to provide an additional feed-forward signal representative of a snap of the movable object.

13. The position control system of claim 1, wherein the one or more actuators are configured to act on the movable object without using the compliance compensation signal.

14. The position control system of claim 1, wherein the module is a comparator.

15. The position control system of claim 1, wherein the position measurement system comprises a plurality of sensors, and the position measurement system is configured to switch between different sets of said sensors to measure the position of the movable object when one of the sensors cannot be used for position measurement.

16. A lithographic apparatus comprising:
    a patterning device support configured to support a patterning device, the patterning device being capable of imparting a radiation beam with a pattern in its cross-section to form a patterned radiation beam;
    a substrate support constructed to hold a substrate;
    a projection system configured to project the patterned radiation beam onto a target portion of the substrate; and
    a position control system configured to control a position of a movable object, the system comprising
        a position measurement system configured to measure a position of the movable object with a sensor and a sensor target, the sensor being arranged on the movable object and the sensor target being substantially stationary, or vice versa, the position measurement system configured to output a measured position signal representative of the measured position of the movable object;
        a comparator configured to provide an error signal;
        a controller configured to provide a control signal based on the error signal;
        a feed-forward device configured to provide a feed-forward signal based on a first signal related to a desired position;
        one or more actuators configured to act on the movable object based on the control signal and the feed-forward signal;
        a compliance compensator configured to provide a compliance compensation signal, and
        a module configured to receive the measured position signal and the compliance compensation signal and provide a feedback signal based on the measured position signal and the compliance compensation signal, the feedback signal to be received by the comparator,
        wherein the error signal is determined using a set-point position signal, the measured position signal, and the compliance compensation signal.

17. The lithographic apparatus of claim 16, wherein the movable object is one of the supports.

18. The lithographic apparatus of claim 16, wherein the module is a comparator.

19. A method for controlling the position of a movable object, comprising:
    determining a position of a sensor or sensor target on the movable object;

determining an error signal;

generating a control signal based on the error signal;

generating a feed-forward signal based on a first signal related to a desired position of the movable object;

actuating one or more actuators based on the control signal and the feed-forward signal, and providing a compliance compensation signal, wherein the error signal is determined by comparing a set-point position signal, a signal representative of the measured position of the movable object, and the compliance compensation signal, and wherein the measured position signal and the compliance compensation signal are inputted in a module to provide a feedback signal based on the measured position signal and the compliance compensation signal.

20. The method of claim 19, wherein the error signal is calculated by adding the compliance compensation signal to the set-point position signal and subtracting the measured position signal.

21. The method of claim 19, wherein the error signal is calculated by subtracting the compensation signal from the measured position signal and subtracting the feedback signal from the set-point position.

22. The method of claim 19, wherein the compliance compensation signal is selected to approximate an effect of internal deformation of the movable object on the measured position.

23. The method of claim 19, wherein the position of the movable object is determined using a redundant set of sensors, and wherein the method further comprises switching between different sensors depending on the position of the movable object.

24. The method of claim 19, further comprising providing a compliance compensation gain based on an approximation of a static part of internal modes of the movable object.

25. The method of claim 19, wherein the compliance compensation signal is used in the main directions of movement of the movable support.

26. The method of claim 19, wherein the feed-forward signal comprises an acceleration feed-forward signal and a snap feed-forward signal.

27. The method of claim 26, wherein the snap feed-forward signal is tuned on residual errors.

28. The method of claim 19, wherein the module is a comparator.

* * * * *